United States Patent
Chen et al.

(10) Patent No.: US 10,333,286 B2
(45) Date of Patent: Jun. 25, 2019

(54) SLIDE RAIL ASSEMBLY AND CABLE MANAGEMENT DEVICE THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Zong-Sian Wong, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 8 days.

(21) Appl. No.: 15/483,002

(22) Filed: Apr. 10, 2017

(65) Prior Publication Data
US 2018/0048130 A1 Feb. 15, 2018

(30) Foreign Application Priority Data
Aug. 12, 2016 (TW) .............................. 105126010 A (51) Int. Cl.
| | |
|---|---|
| *A47B 88/403* | (2017.01) |
| *H02G 3/04* | (2006.01) |
| *A47B 88/443* | (2017.01) |
| *A47B 88/49* | (2017.01) |
| *A47B 88/988* | (2017.01) |
| *A47B 88/483* | (2017.01) |

(Continued)

(52) U.S. Cl.
CPC ......... *H02G 3/0456* (2013.01); *A47B 88/403* (2017.01); *A47B 88/443* (2017.01); *A47B 88/483* (2017.01); *A47B 88/49* (2017.01); *A47B 88/988* (2017.01); *F16C 29/02* (2013.01); *F16C 41/00* (2013.01); *F16L 3/015* (2013.01); *H04Q 1/06* (2013.01); *H05K 7/14* (2013.01); *F16C 2380/00* (2013.01); *H05K 7/1491* (2013.01)

(58) Field of Classification Search
CPC ...... H05K 7/14; H05K 7/1491; H05K 7/1411; H04Q 1/06; H02G 3/0456; A47B 88/49; A47B 88/988; A47B 88/483; A47B 88/00; A47B 88/403; A47B 88/443; A47B 88/447; A47B 88/45; F16C 2380/00; F16C 29/02; F16C 41/00; F16L 3/015
USPC ........................... 248/70, 71, 73, 58; 211/26
See application file for complete search history.

(56) References Cited

U.S. PATENT DOCUMENTS 2,865,979 A * 12/1958 Klassen ............... H02G 11/006
                                                    174/117 R
3,219,750 A * 11/1965 Davies .................... B66C 13/12
                                                    174/69

(Continued)

*Primary Examiner* — Nkeisha Smith
(74) *Attorney, Agent, or Firm* — Rosenberg, Klein & Lee (57) ABSTRACT

A slide rail assembly includes a first rail, a second rail movable with respect to the first rail, and a cable management device. The cable management device includes a first set of arms and a second set of arms connected to the first set of arms. The first set of arms include two arms that are movable with respect to each other. The second set of arms also include two arms that are movable with respect to each other. The cable management device has a portion connected to the first rail and is switched from a first state to a second state in response to the second rail moving with respect to the first rail from a first position to a second position.

4 Claims, 12 Drawing Sheets

(51) Int. Cl.
*F16C 29/02* (2006.01)
*F16C 41/00* (2006.01)
*F16L 3/015* (2006.01)
*H04Q 1/06* (2006.01)
*H05K 7/14* (2006.01)

(56) References Cited

U.S. PATENT DOCUMENTS

| | | | | |
|---|---|---|---|---|
| 3,399,909 A * | 9/1968 | Ambrose | | B60D 1/62 |
| | | | | 137/615 |
| 3,647,936 A * | 3/1972 | Dryg | | H02G 11/006 |
| | | | | 174/69 |
| 5,746,389 A * | 5/1998 | Willmann | | B65H 75/36 |
| | | | | 174/69 |
| 6,326,547 B1 * | 12/2001 | Saxby | | H02G 11/00 |
| | | | | 174/69 |
| 6,896,344 B2 * | 5/2005 | Tsutsumi | | H02G 11/00 |
| | | | | 248/51 |
| 7,472,795 B2 | 1/2009 | Dubon et al. | | |
| 7,554,819 B2 * | 6/2009 | Chen | | H05K 7/1491 |
| | | | | 361/727 |
| 7,746,667 B1 * | 6/2010 | Baiza | | H05K 7/1491 |
| | | | | 361/756 |
| 8,231,014 B2 * | 7/2012 | Chen | | H02G 3/0456 |
| | | | | 211/175 |
| 8,387,933 B2 | 3/2013 | Yu et al. | | |
| 8,780,538 B2 * | 7/2014 | Fu | | H02G 11/006 |
| | | | | 361/679.02 |
| 8,882,055 B2 * | 11/2014 | Yang | | H05K 7/1491 |
| | | | | 174/69 |
| 9,370,121 B2 * | 6/2016 | Chen | | H05K 7/1491 |
| 9,383,038 B2 * | 7/2016 | Chen | | F16L 3/015 |
| 9,480,182 B2 * | 10/2016 | Chen | | F16L 3/015 |
| 9,640,961 B2 * | 5/2017 | Chen | | H02G 3/32 |
| 9,706,680 B2 * | 7/2017 | Chang | | H05K 7/183 |
| 2015/0342081 A1 * | 11/2015 | Chang | | H05K 7/18 |
| | | | | 361/679.02 |
| 2018/0063986 A1 * | 3/2018 | Chen | | H05K 7/1491 |
| 2018/0063987 A1 * | 3/2018 | Chen | | H05K 7/1491 |

* cited by examiner

SLIDE RAIL ASSEMBLY AND CABLE MANAGEMENT DEVICE THEREOF

FIELD OF THE INVENTION

The present invention relates to a cable management device and more particularly to one applicable to a slide rail or a rack system.

BACKGROUND OF THE INVENTION

Generally, an object to be supported in a rack system is mounted to a rack via a pair of slide rail assemblies, wherein the object may be a server, a power supply, or the like and typically has cables. In order to place the cables of the object properly, cable management assemblies (or arms) were developed.

U.S. Pat. No. 7,554,819 B2, for example, discloses a cable management arm assembly for use with a pair of slide rail assemblies. According to FIG. 1 and FIG. 2 of the specification of this US patent, each slide rail assembly includes an outer rail (A), a middle rail (B), and an inner rail (C). The cable management arm assembly includes a front arm (11) and a rear arm (12), which are connected to a support rail (2) via a pivot (13) and can move on the support rail (2). Each of the front arm (11) and the rear arm (12) is provided with a plurality of cable holders (15). More specifically, as shown in FIG. 15 of the specification of this US patent, the rear arm (12) of the cable management arm assembly is connected to the outer rail (A) of one of the slide rail assemblies through a connector (5) while the front arm (11) of the cable management arm assembly is connected to the inner rail (C) of the slide rail assembly through an insertion socket (7). Moreover, one end of the support rail (2) is connected to the middle rail (B) of the slide rail assembly by a first sliding member (3).

U.S. Pat. No. 7,472,795 B2 discloses a management assembly. According to FIG. 1 of the specification of this US patent, a device (36) can be mounted to a rack (31) via a pair of slide assemblies (24, 26). Each of the slide assemblies includes a stationary portion (32) and a movable portion (34). The device (36) is mounted on the movable portions (34). The management assembly includes a first arm (50), a second arm (60), and a cross member (42). The outer end (52) of the first arm (50) and the outer end (62) of the second arm (60) are movably engaged with the cross member (42) through a slider (48), and the inner end (54) of the first arm (50) and the inner end (64) of the second arm (60) are coupled to a first arm bracket (56) and a second arm bracket (66) respectively. The first arm bracket (56) is connected to the movable portion (34) of one of the slide assemblies while the second arm bracket (66) is connected to the stationary portion (32) of the slide assembly. The two ends of the cross member (42) can move along the stationary portions (32) of the slide assemblies (24, 26) by means of a first member bracket (38) and a second member bracket (40) respectively. According to FIG. 3, FIG. 4, and FIG. 5 of the specification of this US patent, the first arm (50) and the second arm (60) are opened with respect to each other and moved along the cross member (42) through the slider (48) when the movable portions (34) and the device (36) are moved from a retracted position to an extended position.

U.S. Pat. No. 8,387,933 B2 discloses a cable management apparatus that includes an arm assembly (10), a first mounting member (20), a second mounting member (30), and a support member (50). The arm assembly (10) includes a rear arm (11) and a front arm (12) connected to the rear arm (11) via a connecting member (14). The front arm (12) includes a first arm segment (121) and a second arm segment (122) connected to the first arm segment (121). The first mounting member (20) is provided with a connecting piece (22) pivotally connected to one end of the rear arm (11) and is mounted to a stationary rail (410). The second mounting member (30) is pivotally connected to one end of the second arm segment (122) and is mounted to an inner rail (430). The support member (50) is located at the rear ends of the intermediate rails (420) of two slide rail apparatuses (400).

While the afore-cited patents provide cable management assemblies on which cables can be placed, all of the cable management assemblies include two pivotally connected arm sections that are configured to open with respect to each other when a movable rail of a slide rail assembly is moved with respect to the stationary rail of the slide rail assembly. As it is sometimes required to increase the extended length of a slide rail assembly (i.e., the maximum distance for which a movable rail of the slide rail assembly can be moved with respect to the stationary rail of the slide rail assembly may have to increase) to meet market demands, a cable management assembly with only two or three arm sections, and hence of a relatively limited extended length, may have problem working with such a slide rail assembly.

SUMMARY OF THE INVENTION

The present invention relates to a multi-section cable management device for use in a rack system designed for electronic equipment.

According to one aspect of the present invention, a cable management device includes a first set of arms and a second set of arms. The first set of arms include two arms that can move with respect to each other. The second set of arms also include two arms that can move with respect to each other. The second set of arms are connected to the first set of arms.

Preferably, the second set of arms are pivotally connected to the first set of arms.

Preferably, one of the two arms of the first set of arms has an end portion pivotally connected to an end portion of one of the two arms of the second set of arms.

Preferably, the two arms of the first set of arms are pivotally connected to each other.

Preferably, the two arms of the second set of arms are pivotally connected to each other.

Preferably, the cable management device further includes an additional arm pivotally connected to the second set of arms.

Preferably, the cable management device further includes a supporting member arranged between and configured for supporting the first set of arms and the second set of arms.

Preferably, one of the two arms of the second set of arms is pivotally connected to the supporting member at a position between two opposite ends of the supporting member.

According to another aspect of the present invention, a slide rail assembly includes a first rail, a second rail, and a cable management device. The second rail can be moved with respect to the first rail. The cable management device includes a first set of arms and a second set of arms. The first set of arms include two arms that are pivotally connected to each other. The second set of arms also include two arms that are pivotally connected to each other. One arm of the second set of arms is pivotally connected to one arm of the first set of arms. The other arm of the first set of arms is connected to the first rail. The cable management device is switched from a first state to a second state in response to the second rail moving with respect to the first rail from a first position to a second position.

Preferably, the slide rail assembly is adapted for mounting an object to a rack. The first rail is mountable to a first post and a second post of the rack via a first bracket and a second bracket respectively, and the second rail is mountable with the object. In some embodiments, the other arm of the first set of arms is connected to the rack, instead of connected to the first rail.

Preferably, the cable management device of the slide rail assembly further includes an additional arm pivotally connected to the other arm of the second set of arms. The additional arm is moved in response to the second rail moving with respect to the first rail from the first position to the second position.

Preferably, the slide rail assembly further includes a third rail movably mounted between the first rail and the second rail.

Preferably, the cable management device of the slide rail assembly further includes a supporting member arranged between and configured for supporting the first set of arms and the second set of arms. The supporting member is displaced in response to the third rail moving with respect to the first rail.

Preferably, one arm of the second set of arms is pivotally connected to the supporting member at a position between two opposite ends of the supporting member.

Preferably, the slide rail assembly further includes a locking member mounted on the third rail. The locking member can be locked to a portion of the second rail, thereby enabling the second rail to move the third rail to a predetermined position in the direction from the first position to the second position while the second rail itself is so moved.

Preferably, the first rail of the slide rail assembly includes a disengaging feature. Once the third rail reaches the predetermined position, the disengaging feature disengages the locking member from the aforesaid portion of the second rail.

Preferably, the first set of arms, the second set of arms, and an additional arm of the cable management device have a cable management feature where a cable of the object can be placed.

DETAILED DESCRIPTION OF THE INVENTION

Figure 1:
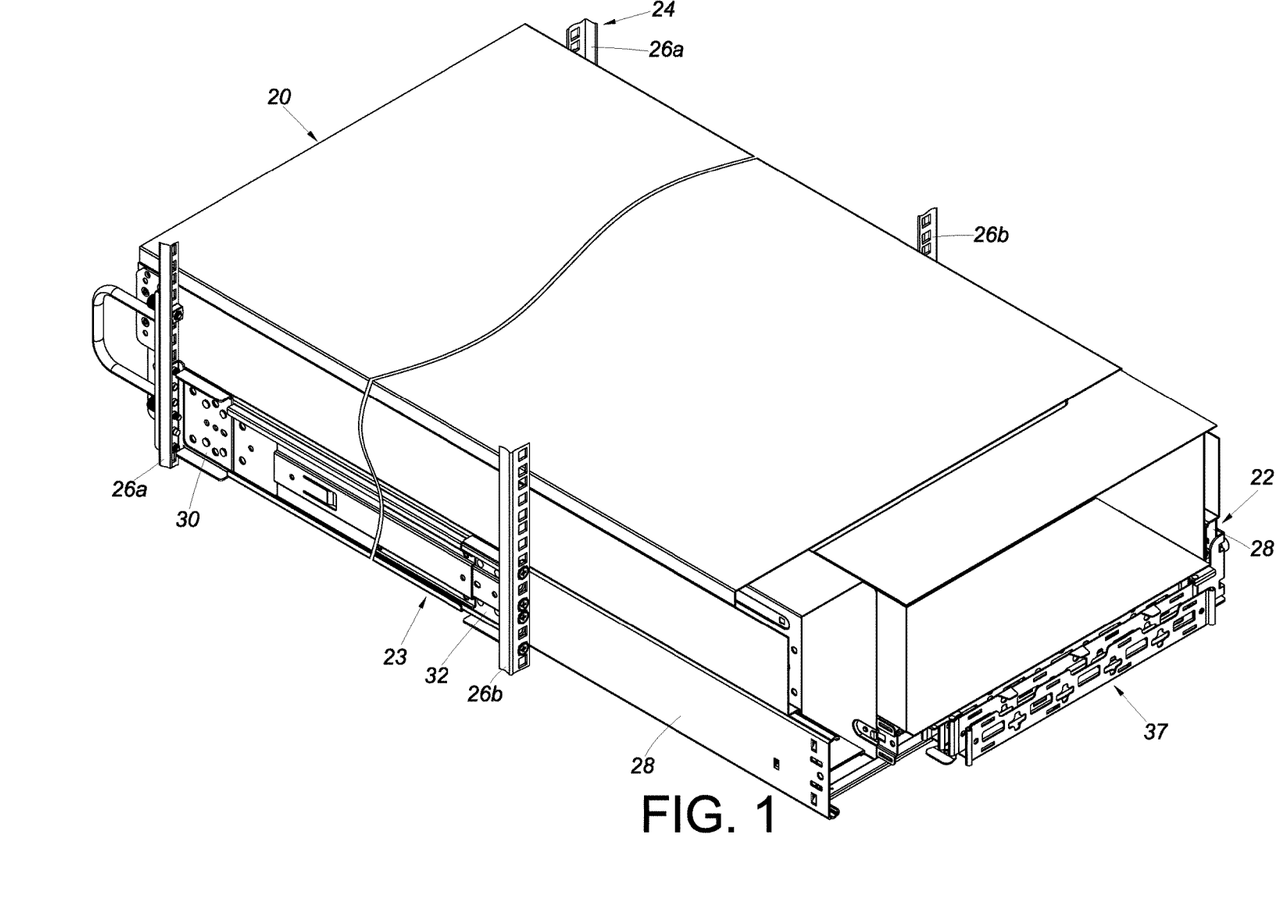
FIG. 1 is a perspective view showing how an object is mounted to a rack via a pair of slide rail assemblies in the first embodiment of the present invention.

Referring to FIG. 1, a rack system includes an object 20 that is mounted to a rack 24 via a first slide rail assembly 22 and a second slide rail assembly 23. The object 20 may be a piece of electronic equipment, such as a server and/or a power supply. The rack 24 includes a pair of first posts 26a and a pair of second posts 26b. Each slide rail assembly includes a first rail 28. Each first rail 28 has two portions respectively arranged with a first bracket 30 (e.g., a front bracket) and a second bracket 32 (e.g., a rear bracket) configured to be mounted to a corresponding one of the first posts 26a and a corresponding one of the second posts 26b of the rack 24 respectively.

Figure 2:
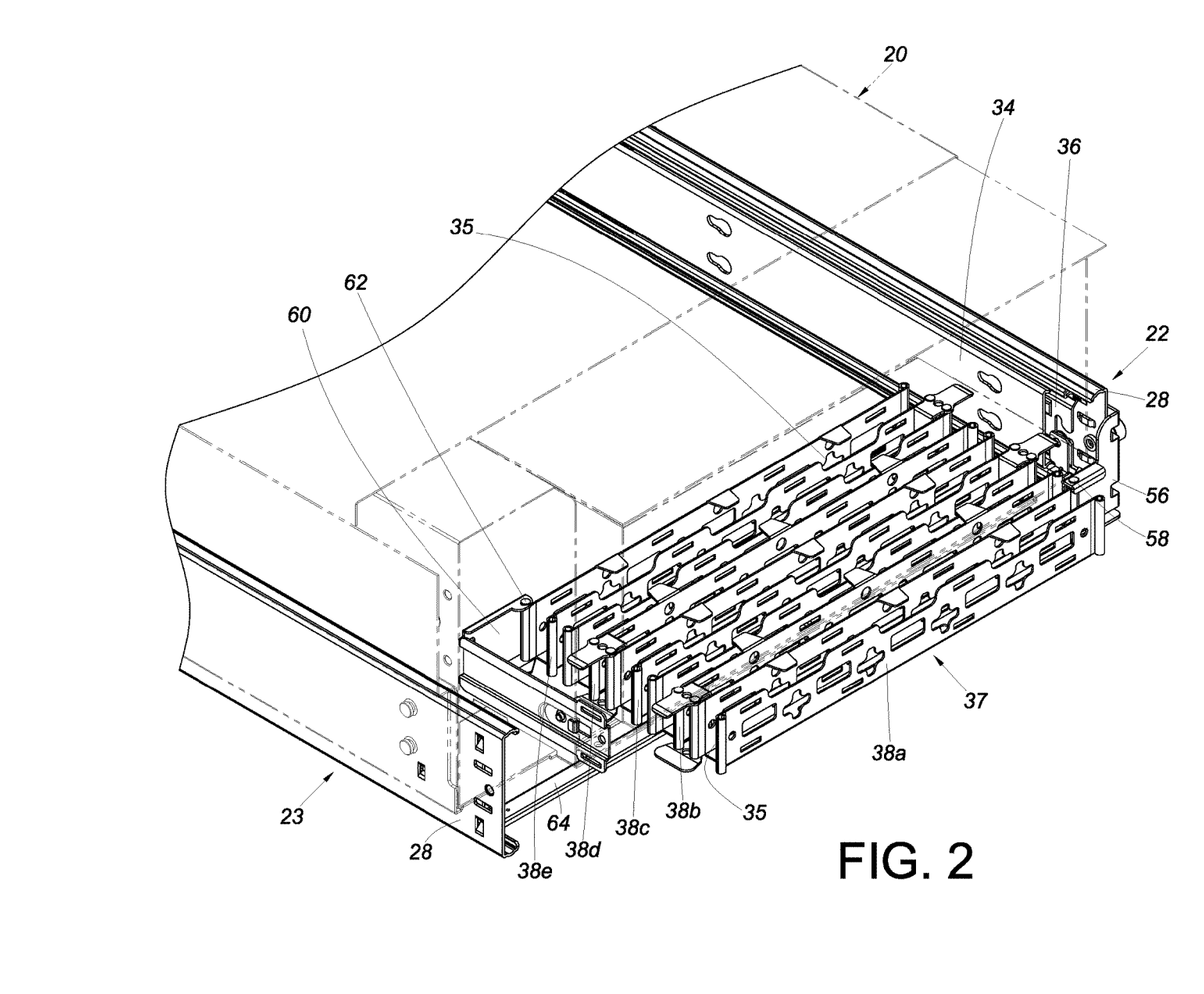
FIG. 2 is a perspective view showing the cable management device in the first embodiment of the present invention located between the object and one of the slide rail assemblies.

As shown in FIG. 2, each slide rail assembly further includes a second rail 34 and a third rail 36. The second rails 34 are mounted with the object 20. Each third rail 36 is movably mounted between the corresponding first rail 28 and the corresponding second rail 34 to increase the maximum distance for which the corresponding second rail 34 can be moved with respect to the corresponding first rail 28. In addition, the rack system includes a cable management device 37 located behind the object 20. More specifically, the cable management device 37 includes a first set of arms and a second set of arms. The first set of arms include two arms, e.g., a first arm 38a and a second arm 38b. The second set of arms also include two arms, e.g., a third arm 38c and a fourth arm 38d. Preferably, the cable management device 37 further includes another arm, e.g., a fifth arm 38e. Each arm 38a, 38b, 38c, 38d, or 38e has at least one cable management feature 35, which may be a groove or cable holder for arranging the cables of the object 20. As the cable management features 35 are well known in the art, further description is omitted herein for the sake of brevity.

Figure 3:
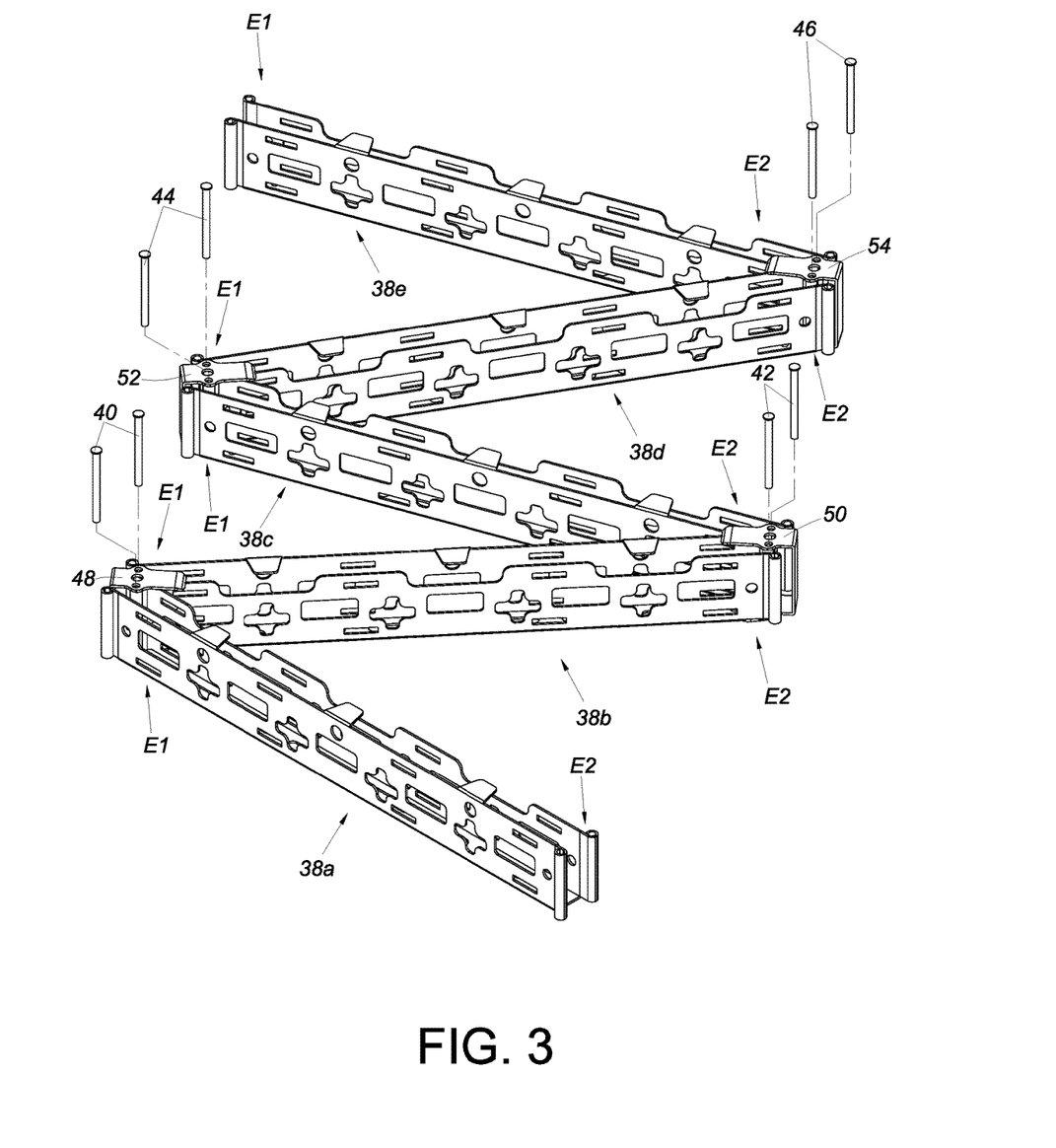
FIG. 3 is a perspective view of the cable management device in the first embodiment of the present invention.

Referring to FIG. 3, the first arm 38a and the second arm 38b of the first set of arms can move with respect to each other, and so can the third arm 38c and the fourth arm 38d of the second set of arms. The fifth arm 38e can move with respect to the second set of arms. The third arm 38c of the second set of arms is connected to the second arm 38b of the first set of arms in such a way that the third arm 38c and the second arm 38b can move with respect to each other.

In this embodiment, each arm 38a, 38b, 38c, 38d, or 38e includes two portions (e.g., a first end portion E1 and a second end portion E2 that are located at two opposite ends of each arm respectively) configured for terminal connection. These arms 38a, 38b, 38c, 38d, and 38e are sequentially and pivotally connected by at least one first pivotal connection element 40, at least one second pivotal connection element 42, at least one third pivotal connection element 44, and at least one fourth pivotal connection element 46.

More specifically, the first end portions E1 of the first arm 38a and the second arm 38b of the first set of arms are pivotally connected by two first pivotal connection elements 40 (e.g., with a first auxiliary base 48 arranged between the first arm 38a and the second arm 38b to facilitate pivotal connection by the first pivotal connection elements 40), the second end portion E2 of the second arm 38b of the first set of arms and the second end portion E2 of the third arm 38c of the second set of arms are pivotally connected by two second pivotal connection elements 42 (e.g., with a second auxiliary base 50 arranged between the second arm 38b and the third arm 38c to facilitate pivotal connection by the second pivotal connection elements 42), the first end portion E1 of the third arm 38c of the second set of arms and the first end portion E1 of the fourth arm 38d of the second set of arms are pivotally connected by two third pivotal connection elements 44 (e.g., with a third auxiliary base 52 arranged between the third arm 38c and the fourth arm 38d to facilitate pivotal connection by the third pivotal connection elements 44), and the second end portion E2 of the fourth arm 38d of the second set of arms and the second end portion E2 of the fifth arm 38e are pivotally connected by two fourth pivotal connection elements 46 (e.g., with a fourth auxiliary base 54 arranged between the fourth arm 38d and the fifth arm 38e to facilitate pivotal connection by the fourth pivotal connection elements 46). The foregoing arrangement makes it possible for the arms 38a, 38b, 38c, 38d, and 38e to move with respect to one another. It is worth mentioning that, while the arms 38a, 38b, 38c, 38d, and 38e in this embodiment are pivotally connected through the additional auxiliary bases 48, 50, 52, and 54, it is feasible in practice that the arms 38a, 38b, 38c, 38d, and 38e are pivotally connected directly by the pivotal connection elements; the present invention has no limitations in this regard.

Figure 4:
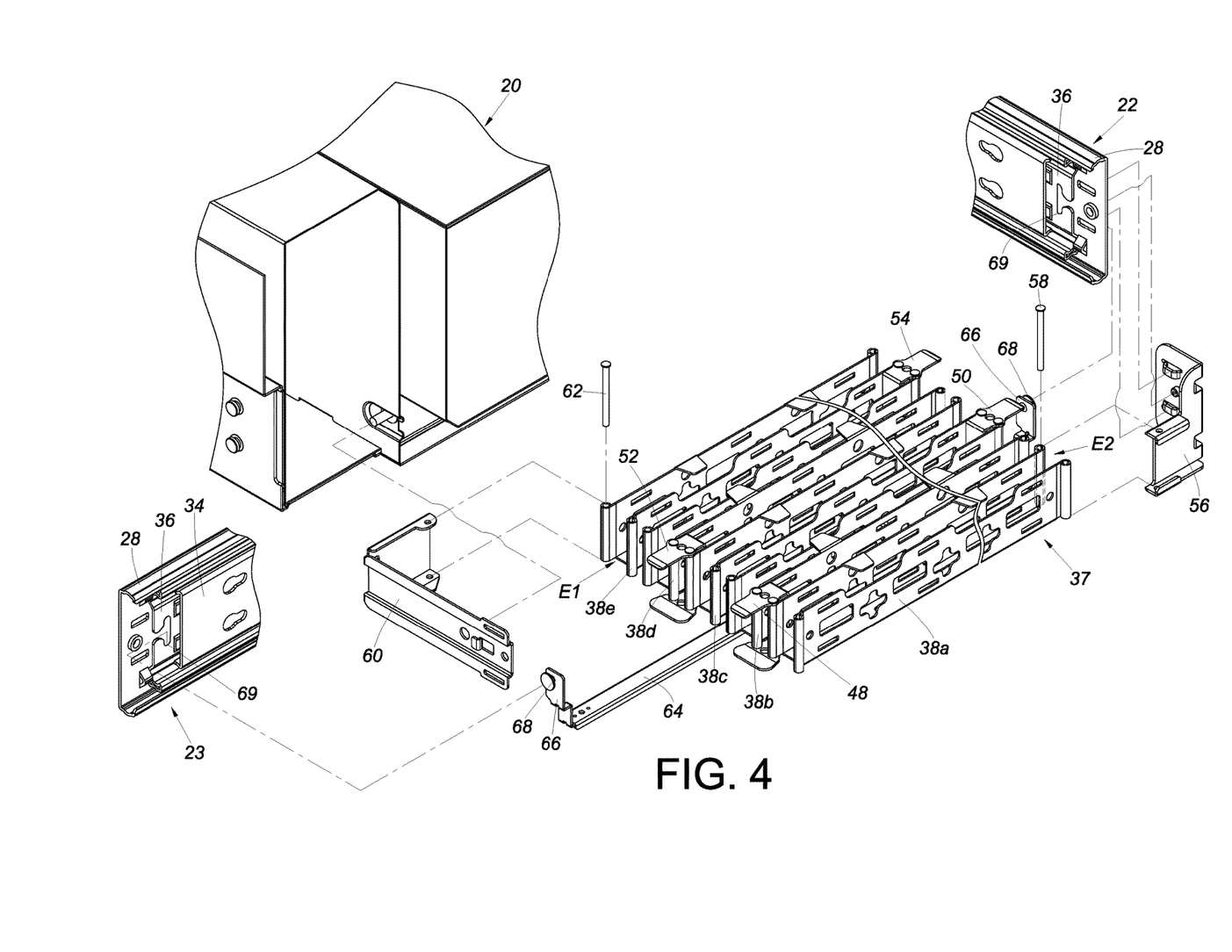
FIG. 4 is an exploded perspective view of the cable management device, the object, and the slide rail assemblies in the first embodiment of the present invention.

Referring to FIG. 4, the second end portion E2 of the first arm 38a of the first set of arms is connected to the first rail 28 of the first slide rail assembly 22 (e.g., with a fifth pivotal connection element 58 connecting the second end portion E2 of the first arm 38a to a first fitting 56 arranged adjacent to the rear end of the first rail 28 of the first slide rail assembly 22), and the first end portion E1 of the fifth arm 38e is connected to the object 20 (e.g., with a sixth pivotal connection element 62 connecting the first end portion E1 of the fifth arm 38e to a second fitting 60 arranged adjacent to a rear portion of the object 20).

Preferably, the cable management device 37 further includes a supporting member 64 arranged between and configured for supporting the arms 38a, 38b, 38c, 38d, and 38e. The supporting member 64 may be mounted to the third rail 36 of one of the first slide rail assembly 22 and the second slide rail assembly 23 or to the third rails 36 of both slide rail assemblies 22 and 23. For example, the two opposite ends of the supporting member 64 are mounted to the third rails 36 of the two slide rail assemblies 22 and 23 respectively. Preferably, each of the two ends of the supporting member 64 has a mounting member 66 (as can be seen more clearly in FIG. 6) to be detachably hung on a supporting portion 69 adjacent to the rear end of the corresponding third rail 36 via a mounting feature 68 such as a hook or peg. It is worth mentioning that, while the supporting member 64 in this embodiment is "mounted" to the third rails 36, it is feasible in practice that the supporting member 64 is "threadedly connected" to the third rails 36 instead; the present invention has no limitations in this regard.

Figure 5:
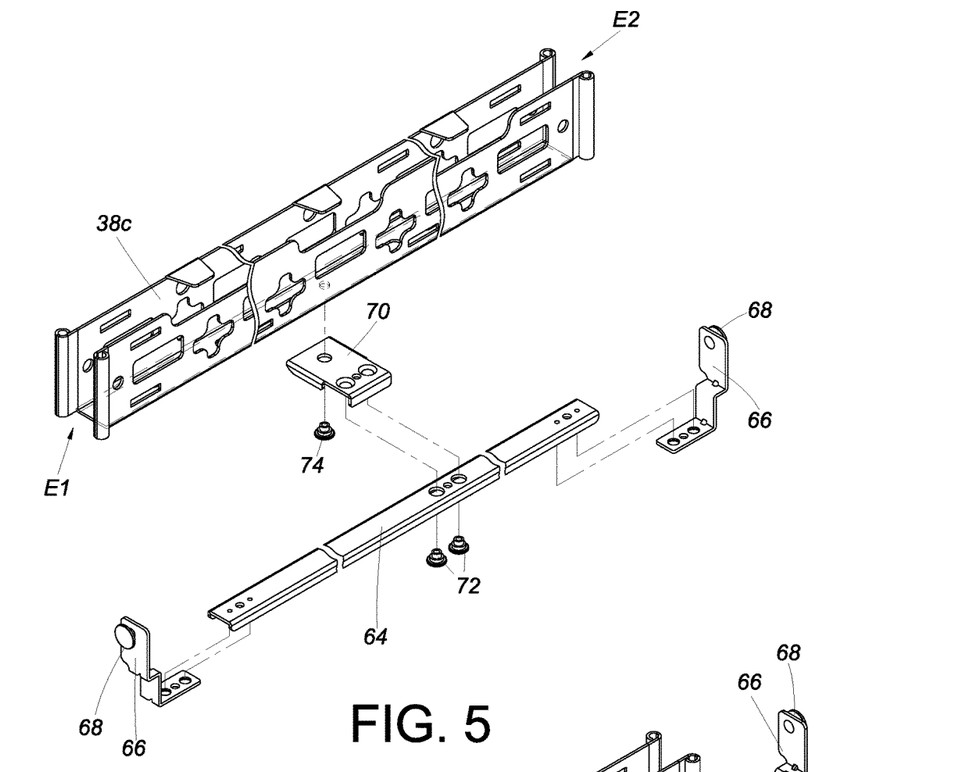
FIG. 5 is an exploded perspective view of an arm and the supporting member of the cable management device in the first embodiment of the present invention.
Figure 6:
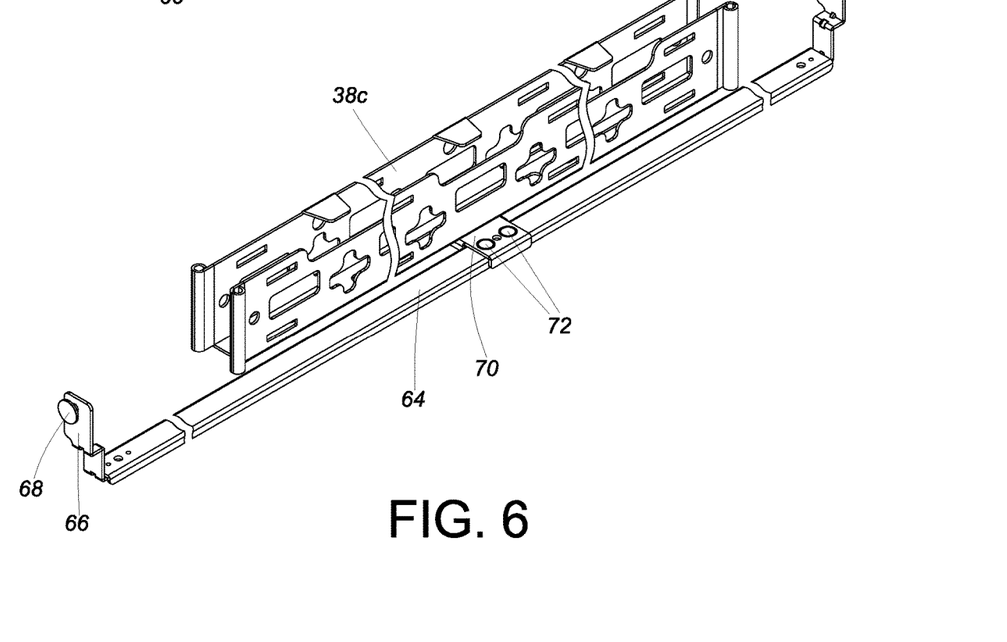
FIG. 6 is an assembled perspective view of the arm and the supporting member in FIG. 5.

As shown in FIG. 5 and FIG. 6, one of the two arms of the second set of arms (e.g., the third arm 38c) is pivotally connected to the supporting member 64 at a position between the two ends of the supporting member 64. For example, the cable management device 37 further includes a connecting component 70 mounted between the two ends of the supporting member 64 via two fixing members 72, and a portion of the third arm 38c that is between the first end portion E1 and the second end portion E2 is pivotally connected to the connecting component 70 via a shaft member 74.

Figures 7, 8, 9:
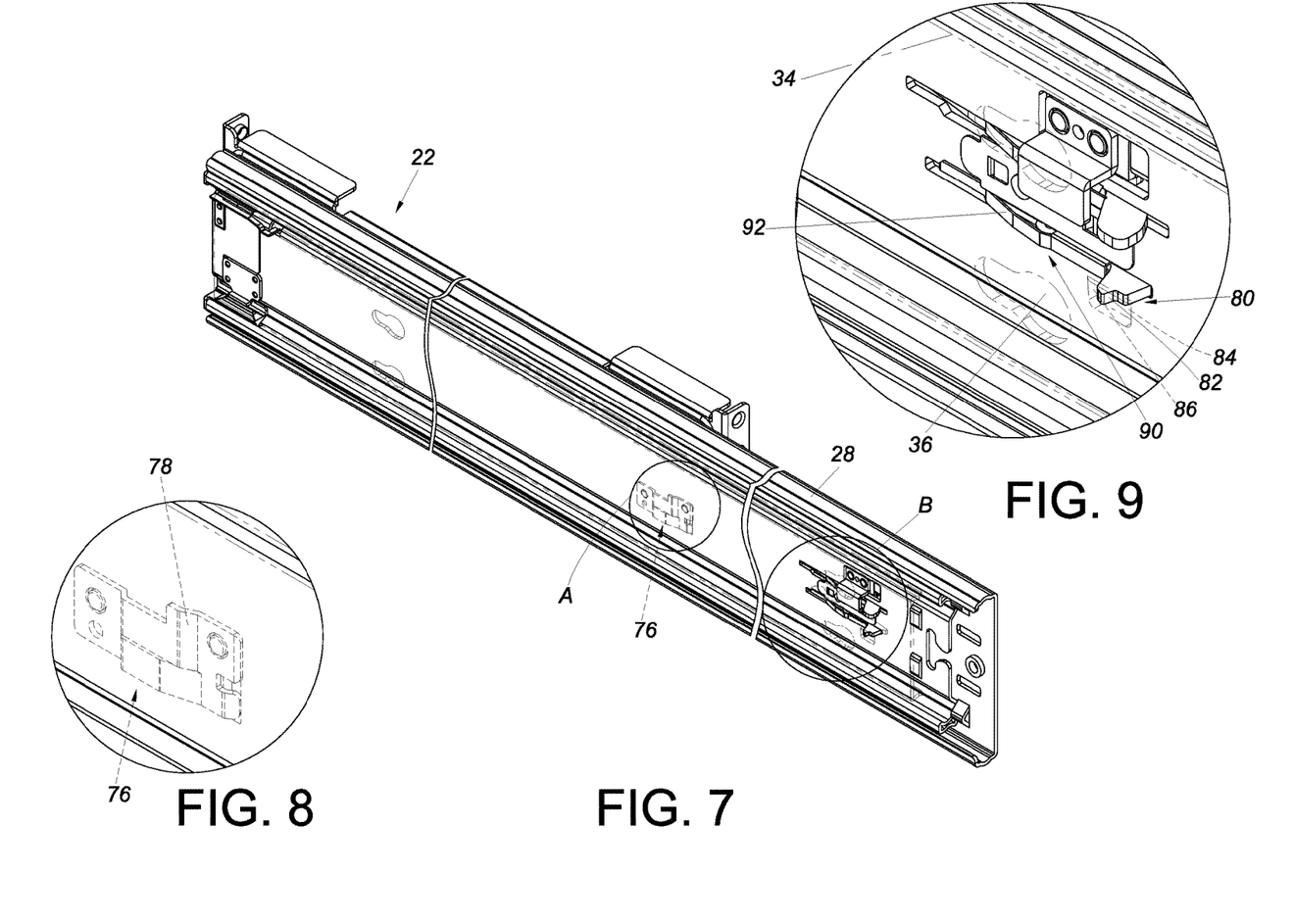
FIG. 7 is a perspective view of a slide rail assembly in the first embodiment of the present invention.
FIG. 8 is an enlarged view of the circled area A in FIG. 7, showing that the first rail of the slide rail assembly includes a disengaging feature.
FIG. 9 is an enlarged view of the circled area B in FIG. 7, showing that a locking member of the third rail of the slide rail assembly can be locked to a portion of the second rail.

Referring to FIG. 7 and FIG. 8, the first rail 28 of each slide rail assembly (e.g., of the first slide rail assembly 22 shown in the drawings) includes a disengaging feature 76. The disengaging feature 76 may be an additional component connected to the first rail 28 by riveting, welding, threaded connection, or the like. Alternatively, the disengaging feature 76 may be directly formed on the first rail 28 by a machining process that provides the disengaging feature 76 with a specific shape or structure. In this embodiment, the disengaging feature 76 has a guiding section 78 such as an inclined or curved surface. Referring to FIG. 9, the first slide rail assembly 22 further includes a locking member 80 mounted on the third rail 36 and having a locking portion 82. On the other hand, the second rail 34 has a hole 84 and a stop 86 adjacent to the hole 84. The locking portion 82 of the locking member 80 is configured to be locked to the stop 86.

Figure 10:
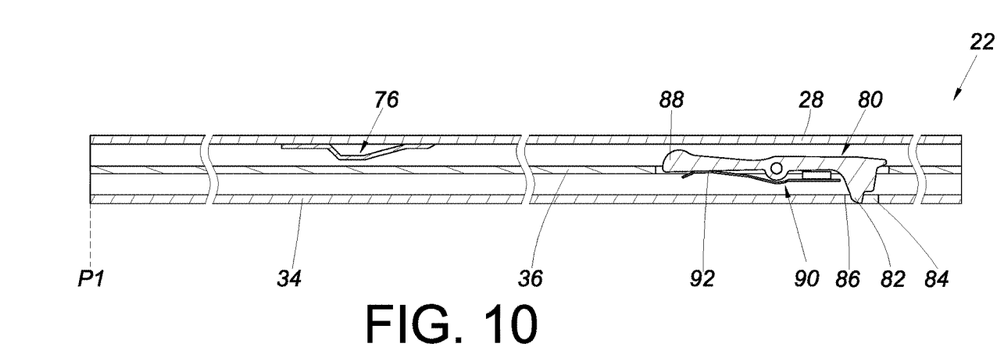
FIG. 10 shows a slide rail assembly in the first embodiment of the present invention in a retracted state.

Referring to FIG. 10, each slide rail assembly (e.g., the first slide rail assembly 22 shown in the drawing) can be brought to a certain state, such as a retracted state, in which the second rail 34 and the third rail 36 of the first slide rail assembly 22 are at a first position P1 with respect to the first rail 28. In addition, the locking member 80 further includes a contact portion 88, and a portion of the locking member 80 that is between the contact portion 88 and the locking portion 82 is pivotally connected to the third rail 36. Preferably, an elastic member 90 applies an elastic force to the locking member 80 and has an elastic portion 92 pressed against the contact portion 88 to keep the contact portion 88 facing the first rail 28. Also, the locking portion 82 can extend into the hole 84 to stay locked to the stop 86 of the second rail 34.

Figure 11:
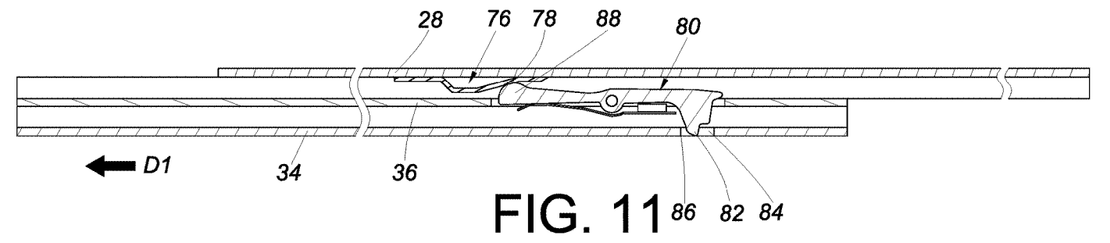
FIG. 11 shows that the second rail and the third rail of the slide rail assembly in FIG. 10 are simultaneously moved with respect to the first rail in a certain direction.
Figure 12:
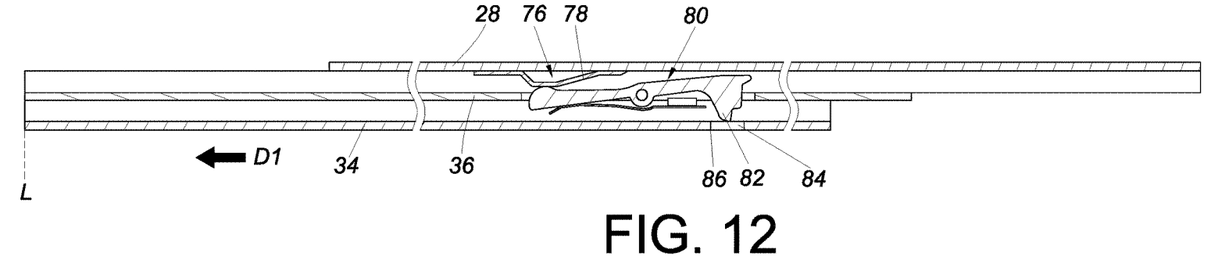
FIG. 12 shows that simultaneous movement of the second rail and the third rail in FIG. 11 ends at a predetermined position.

Referring to FIG. 11 and FIG. 12, when the second rail 34 and the third rail 36 are moved in a first direction D1 (e.g., an extending direction) with respect to the first rail 28 from the first position P1, the locking portion 82 of the locking member 80 is locked to the stop 86 of the second rail 34 such that the second rail 34 and the third rail 36 are moved together in the first direction D1. When the second rail 34 and the third rail 36 moving in the first direction D1 are about to reach a predetermined position L, the contact portion 88 of the locking member 80 comes into contact with the guiding section 78 of the disengaging feature 76 of the first rail 28, and the locking member 80 is tilted as a result, thereby releasing the locking portion 82 of the locking member 80 from the stop 86 of the second rail 34. In other words, once the third rail 36 is moved in the first direction D1 with respect to the first rail 28 and reaches the predetermined position L, the disengaging feature 76 terminates the locking relationship between the locking member 80 and the stop 86 of the second rail 34 by disengaging the locking portion 82 of the locking member 80 from the stop 86. The third rail 36 in this state no longer moves along with the second rail 34. That is to say, the second rail 34 can now be moved further in the first direction D1 with respect to the third rail 36.

Figure 13:
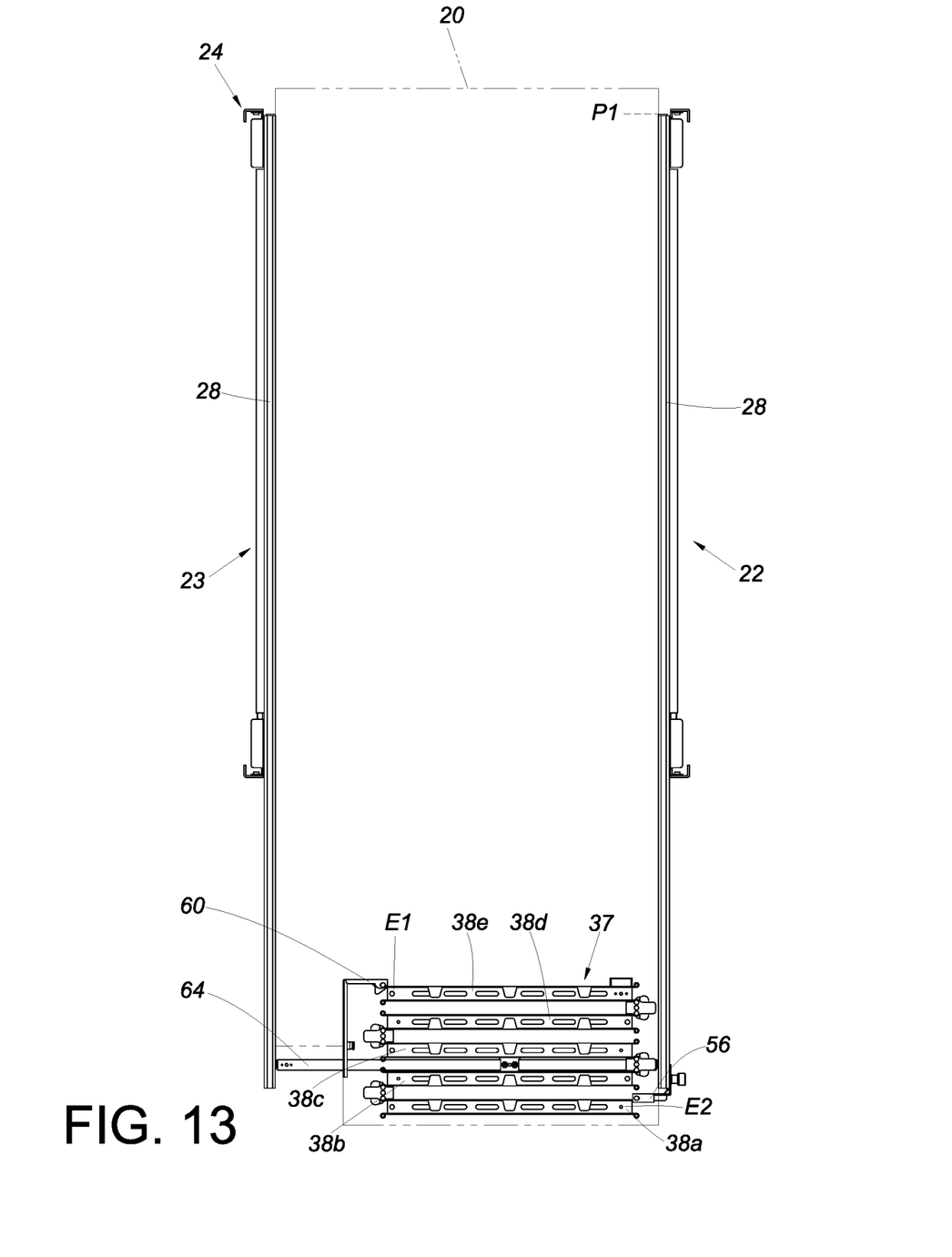
FIG. 13 shows that the object in the first embodiment of the present invention is mounted on the rack via the slide rail assemblies, and that the cable management device is in a first state.

In FIG. 13, the slide rail assemblies 22 and 23 are in the retracted state. As stated above, the second end portion E2 of the first arm 38a of the cable management device 37 is pivotally connected to the first fitting 56 on the first rail 28 of the first slide rail assembly 22, and the first end portion E1 of the fifth arm 38e of the cable management device 37 is pivotally connected to the second fitting 60 on the object 20. In addition, the cable management device 37 is supported by the supporting member 64. Moreover, when both slide rail assemblies 22 and 23 are in the retracted state, most of the object 20 is inside the rack 24, and the cable management device 37 is in a first state, in which the arms 38a, 38b, 38c, 38d, and 38e of the cable management device 37 are close to one another.

Figure 14:
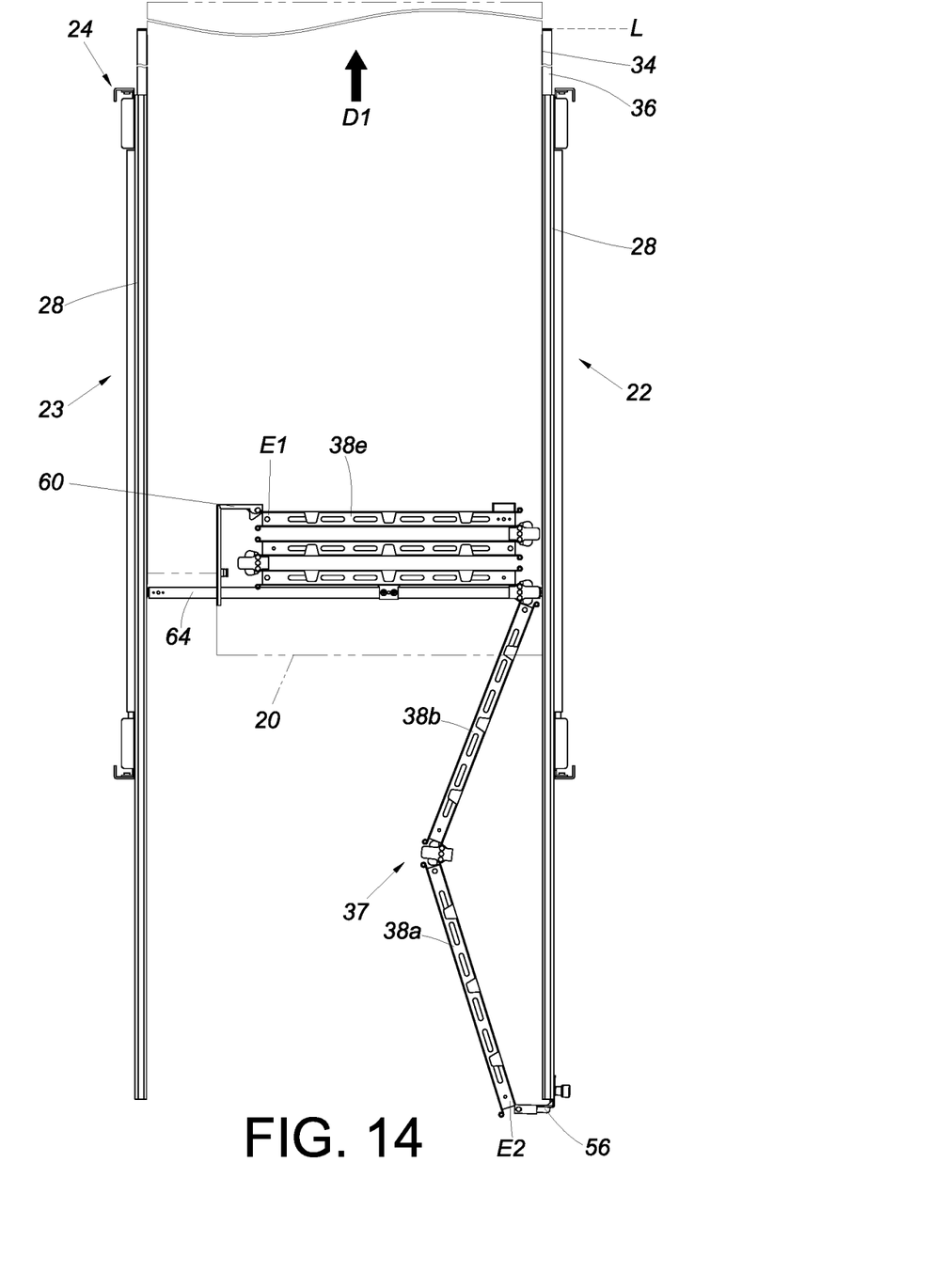
FIG. 14 shows that the second rails and the third rails of the slide rail assemblies in FIG. 13 are moved with respect to the first rails in the direction indicated by the arrow in FIG. 11, that the cable management device is gradually switched to a second state, and that the supporting member is displaced along with the third rail.

Referring to FIG. 13 and FIG. 14, when the object 20 is pulled out of the rack 24, thus moving the second rails 34 and the third rails 36 in the first direction D1 (e.g., the extending direction) with respect to the first rails 28 from the first position P1, the object 20 itself is displaced outward of the rack 24 in the first direction D1. During the process, the second rails 34 and the third rails 36 can be simultaneously moved in the first direction D1 only until the predetermined position L is reached, and after that, the third rails 36 can no longer move together with the second rails 34 (refer to FIG. 10, FIG. 11, FIG. 12, and the related description for the principle of simultaneous movement of the second rails 34 and the third rails 36 and the mechanism of stopping such movement).

More specifically, in the course in which the second rails 34 and the third rails 36 are moved in the first direction D1, the supporting member 64 is displaced in response to the third rails 36 moving with respect to the first rails 28. Meanwhile, the cable management device 37 is gradually switched from the first state to a second state (e.g., an opened state) in response to the second rails 34 moving in the first direction D1 with respect to the first rails 28 from the first position P1. Also, the fifth arm 38e is moved in response to the second rails 34 (or the object 20) moving in the first direction D1 with respect to the first rails 28 from the first position P1. The first arm 38a and the second arm 38b of the first set of arms are opened first because the third rails 36 move along with the second rails 34. When the second rails 34 and the third rails 36 arrive at the predetermined position L, simultaneous movement of the second rails 34 and the third rails 36 is brought to an end.

Figure 15:
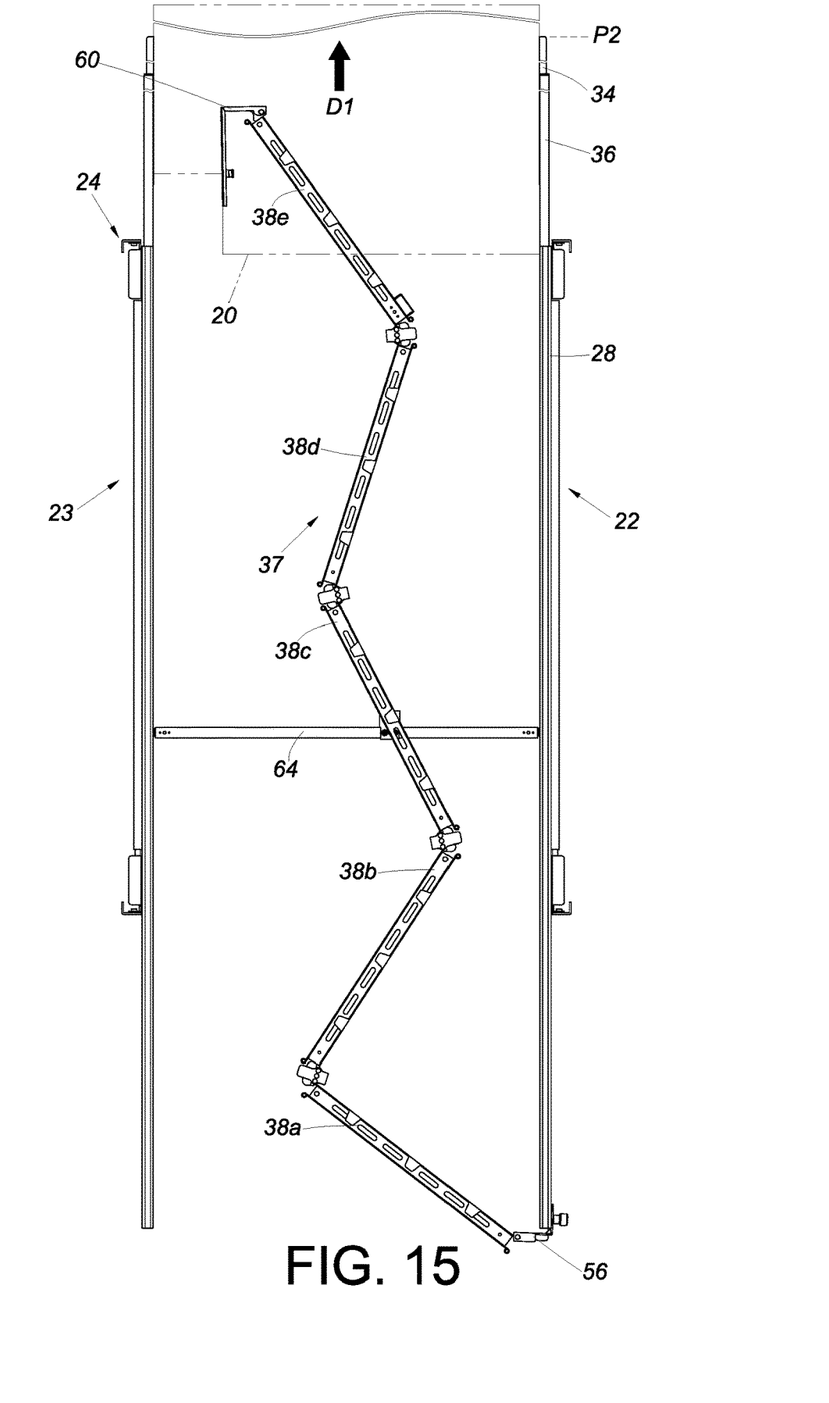
FIG. 15 shows that the second rails in FIG. 14 are further moved with respect to the first rails in the same direction, and that the cable management device is in the second state.

Referring to FIG. 15, once the simultaneous movement is ended, the second rails 34 (or the object 20) can be further moved in the first direction D1 with respect to the third rails 36, thereby moving the fifth arm 38e of the cable management device 37 further. Since one of the two arms of the second set of arms (e.g., the third arm 38c) is pivotally connected to a portion of the supporting member 64 that is between the two ends of the supporting member 64, the third arm 38c and the fourth arm 38d of the second set of arms will be sequentially opened in response to the movement of the fifth arm 38e and then drive the first arm 38a and the second arm 38b of the first set of arms into movement. When the second rails 34 reach a second position P2 with respect to the first rails 28 such that the slide rail assemblies are fully extended, the cable management device 37 is in the second state.

It is worth mentioning that, when the second rails 34 are moved back to the first position P1 with respect to the first rails 28 in a second direction (e.g., a retracting direction, which is the opposite direction of the first direction D1) from the second position P2, the cable management device 37 returns from the second state to the first state (the process of which can be understood by referring to FIG. 13 and therefore will not be described herein).

According to the above, the cable management device 37 in this embodiment can adapt to slide rail assemblies of a greater total extended length than can the prior art, thanks to the multi-section (e.g., more-than-four-section) cable management arm consisting of the arms 38a, 38b, 38c, 38d, and 38e. Furthermore, the multi-section cable management device 37 can be opened and closed in stages or in sequence, thus featuring steady opening and closing operations, due to the fact that the second rails 34 and the third rails 36 can move simultaneously for a predetermined distance, and that one of the two arms 38c and 38d of the second set of arms is pivotally connected to the supporting member 64 (at a position between two opposite ends of the supporting member 64).

Figure 16:
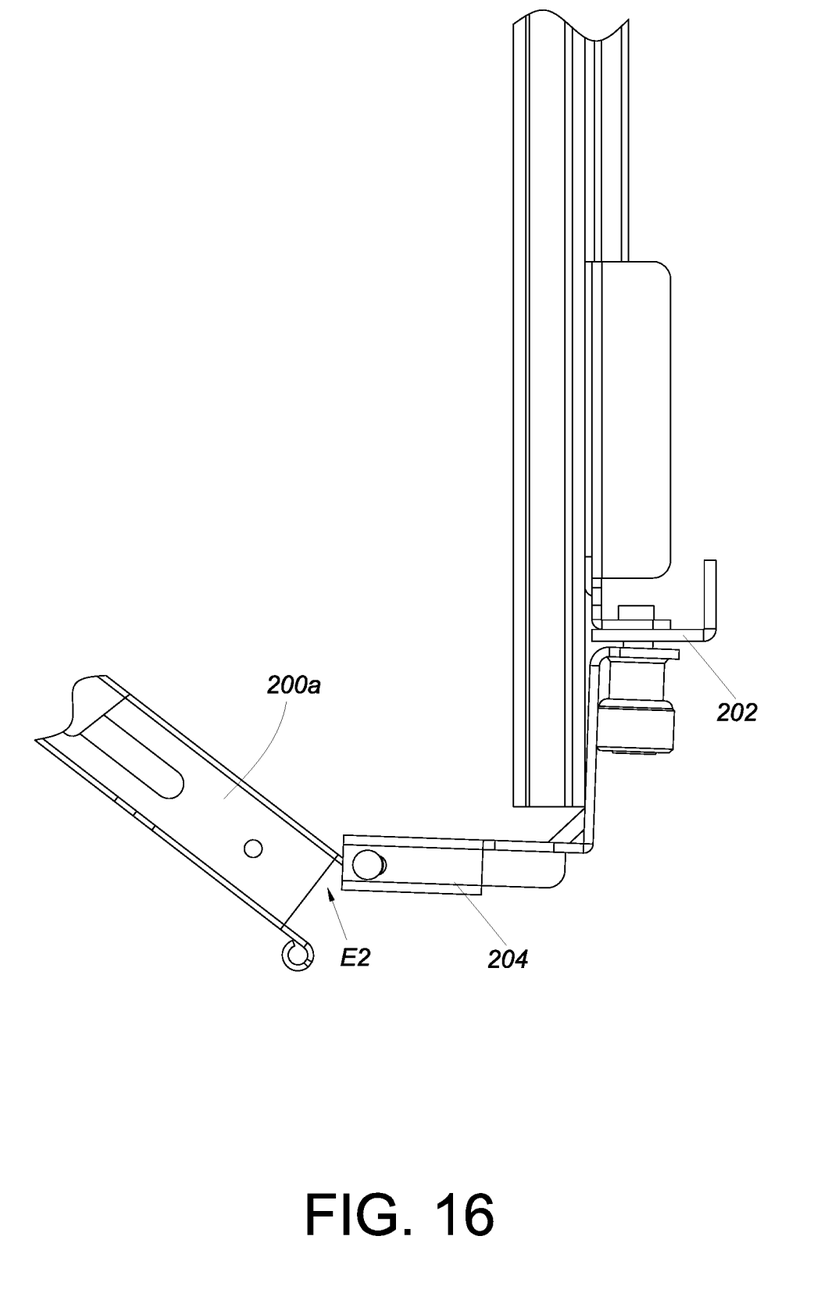
FIG. 16 shows that, in the second embodiment of the present invention, the first arm of the first set of arms of the cable management device is connected to a rack.

FIG. 16 shows the second embodiment of the present invention. The second embodiment is different from the first embodiment generally in that the second end portion E2 of the first arm 200a of the first set of arms is connected to the second post 202 of the rack. For instance, the second end portion E2 of the first arm 200a is pivotally connected to a third fitting 204 on the second post 202.

Figure 17:
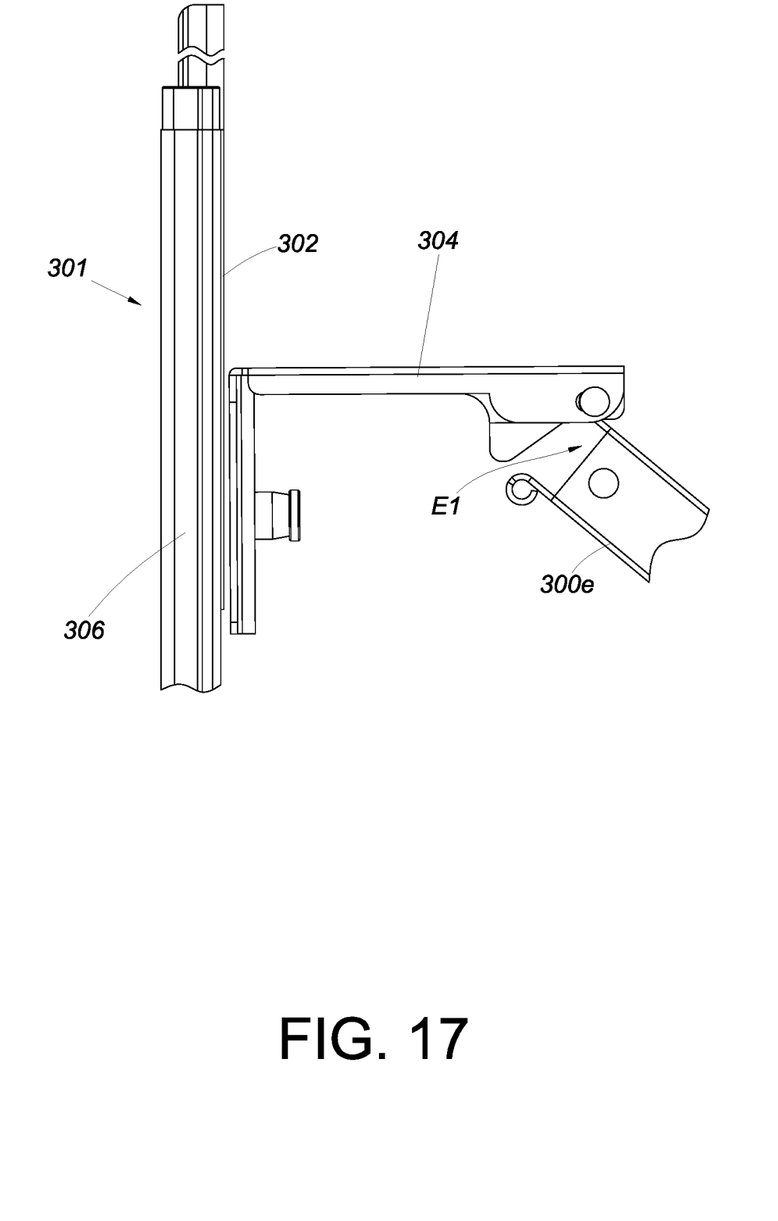
FIG. 17 shows that, in the third embodiment of the present invention, the fifth arm of the cable management device is connected to the second rail of a slide rail assembly.

FIG. 17 shows the third embodiment of the present invention. In contrast to the fifth arm 38e in the first embodiment, whose first end portion E1 is connected to the object 20, the fifth arm 300e of the cable management device in the third embodiment has its first end portion E1 connected to the second rail 302 of the slide rail assembly 301. For instance, the first end portion E1 of the fifth arm 300e is pivotally connected to a fourth fitting 304 on the second rail 302. This configuration is equally capable of switching the cable management device from a first state to a second state in response to the second rail 302 moving with respect to the first rail 306.

While the present invention has been disclosed through the foregoing preferred embodiments, it should be understood that the embodiments provided herein are not intended to be restrictive of the scope of the invention. The scope of patent protection sought by the applicant is defined by the appended claims.

What is claimed is:
1. A slide rail assembly, comprising:
a first rail;
a second rail movable with respect to the first rail; and
a cable management device comprising:
a first set of arms including a first arm pivotally connected to a second arm;
a second set of arms including a third arm pivotally connected to a fourth arm, wherein said third arm of the second set of arms is pivotally connected to said second arm of the first set of arms; and a third rail movably mounted between the first rail and the second rail, wherein the cable management device further comprises a supporting member arranged between and configured for supporting the first set of arms and the second set of arms, and the supporting member is displaced in response to the third rail moving with respect to the first rail;

wherein said first arm of the first set of arms is connected to the first rail;

wherein the cable management device is switched from a first state to a second state in response to the second rail moving with respect to the first rail from a first position to a second position; and wherein said third arm of the second set of arms is the only arm directly pivotally connected to the supporting member at a position between two opposite ends of the supporting member.

2. The slide rail assembly of claim 1, wherein the cable management device further comprises a fifth arm pivotally connected to the fourth arm of the second set of arms, and the fifth arm is moved in response to the second rail moving with respect to the first rail from the first position to the second position.

3. The slide rail assembly of claim 1, further comprising a locking member mounted on the third rail, wherein the locking member is configured to be locked to a portion of the second rail and thereby enable the second rail to move the third rail to a predetermined position in a direction from the first position to the second position while the second rail itself is so moved.

4. The slide rail assembly of claim 3, wherein the first rail includes a disengaging feature for disengaging the locking member from the portion of the second rail when the third rail reaches the predetermined position.

* * * * *